(12) United States Patent
Inoue et al.

(10) Patent No.: US 8,653,379 B2
(45) Date of Patent: Feb. 18, 2014

(54) ELECTRONIC PART, ELECTRONIC MEMBER CONNECTION METHOD, AND CIRCUIT CONNECTION MEMBER

(75) Inventors: Kazuo Inoue, Tokyo (JP); Ryouji Setaka, Tokyo (JP); Tsuyoshi Yamakoshi, Tokyo (JP)

(73) Assignee: JSR Corporation, Tokyo (JP)

( * ) Notice: Subject to any disclaimer, the term of this patent is extended or adjusted under 35 U.S.C. 154(b) by 285 days.

(21) Appl. No.: 13/094,846

(22) Filed: Apr. 27, 2011

(65) Prior Publication Data

US 2011/0266037 A1      Nov. 3, 2011

(30) Foreign Application Priority Data

Apr. 28, 2010   (JP) ................. 2010-103968
Jan. 24, 2011   (JP) ................. 2011-011980

(51) Int. Cl.
*H05K 1/03* (2006.01)
*H05K 3/32* (2006.01)

(52) U.S. Cl.
CPC ..................... *H05K 3/325* (2013.01)
USPC .......................... 174/256; 361/807

(58) Field of Classification Search
CPC .................................. H05K 3/325
USPC ............. 174/256, 250, 260; 29/829, 830; 361/760, 807
See application file for complete search history.

(56) References Cited

U.S. PATENT DOCUMENTS

| | | | | |
|---|---|---|---|---|
| 6,549,418 | B1* | 4/2003 | Deeney | 361/736 |
| 2006/0113356 | A1* | 6/2006 | Matsumura et al. | 228/101 |
| 2006/0154500 | A1* | 7/2006 | Igarashi et al. | 439/86 |
| 2008/0297301 | A1* | 12/2008 | Onken et al. | 337/219 |
| 2009/0135573 | A1* | 5/2009 | Sato et al. | 361/803 |
| 2010/0297857 | A1* | 11/2010 | Ito | 439/65 |

FOREIGN PATENT DOCUMENTS

| | | |
|---|---|---|
| JP | 2003-297459 | 10/2003 |
| JP | 2009-217969 | 9/2009 |
| JP | 2010-027343 | 2/2010 |

* cited by examiner

*Primary Examiner* — Yuriy Semenenko
(74) *Attorney, Agent, or Firm* — Ditthavong Mori & Steiner, P.C.

(57) ABSTRACT

An electronic part includes a first electronic member having a wiring side. An anisotropic conductive sheet has a first side and a second side opposite to the first side and is disposed on the first electronic member so that the wiring side contacts the first side. A second electronic member has a third side and a fourth side opposite to the third side and is disposed on the anisotropic conductive sheet so that the second side contacts the third side. The second electronic member is electrically connected to the first electronic member through the anisotropic conductive sheet. An elastic body has a fifth side and a sixth side opposite to the fifth side and is disposed on the second electronic member so that the fourth side contacts the fifth side. A pressing member is disposed on the sixth side of the elastic body.

15 Claims, 12 Drawing Sheets

ELECTRONIC PART, ELECTRONIC MEMBER CONNECTION METHOD, AND CIRCUIT CONNECTION MEMBER

The present application claims priority under 35 U.S.C. §119 to Japanese Application No. 2011-011980, filed Jan. 24, 2011 and Japanese Application No. 2010-103968, filed Apr. 28, 2010. The contents of these applications are incorporated herein by reference in their entirety.

BACKGROUND OF THE INVENTION

1. Field of the Invention

The present invention relates to an electronic part, an electronic member connection method, and a circuit connection member.

2. Discussion of the Background

In the fields of electronic computers, digital clocks, electronic cameras, computer keyboards, and the like, two electronic members have been electrically connected by disposing a connector such as an anisotropic conductive sheet between the electronic members. Connectors configured in various ways have been proposed.

Japanese Patent Application Publication (KOKAI) No. 2003-297459 discloses an electrical connector that connects electronic members, and includes an anisotropic conductive sheet that includes conductive thin wires that suppress adhesion of impurities and rarely undergo contact failure, a first flexible printed circuit board, and a second flexible printed circuit board.

Japanese Patent Application Publication (KOKAI) No. 2010-27343 aims at making it unnecessary to provide a housing or a screw that maintains a connection state when electrically connecting two circuit boards (electronic members) using a connector, and discloses a connection-maintaining device that includes a plate-like holding member, and a holding member formed by a linear elastic member.

Japanese Patent Application Publication (KOKAI) No. 2009-217969 aims at suppressing contact failure even if the connection target (electronic member) is deformed, and discloses an electrical connector device that includes an insulating member, and a distance adjustment member that is secured on the insulating member so as to be movable in the thickness direction, and adjusts the distance between two connection targets.

SUMMARY OF THE INVENTION

According to one aspect of the present invention, an electronic part includes a first electronic member, an anisotropic conductive sheet, a second electronic member, an elastic body, and a pressing member. The first electronic member has a wiring side. The anisotropic conductive sheet has a first side and a second side opposite to the first side and is disposed on the first electronic member so that the wiring side of the first electronic member contacts the first side of the anisotropic conductive sheet. The second electronic member has a third side and a fourth side opposite to the third side and is disposed on the anisotropic conductive sheet so that the second side of the anisotropic conductive sheet contacts the third side of the second electronic member. The second electronic member is electrically connected to the first electronic member through the anisotropic conductive sheet. The elastic body has a fifth side and a sixth side opposite to the fifth side and is disposed on the second electronic member so that the fourth side of the second electronic member contacts the fifth side of the elastic body. The pressing member is disposed on the sixth side of the elastic body.

According to another aspect of the present invention, an electronic member connection method includes disposing an anisotropic conductive sheet between a first electronic member and a second electronic member. An elastic body is disposed on the second electronic member. A pressing member is disposed on the elastic body. The pressing member is pressed so that the first electronic member is electrically connected to the second electronic member.

According to further aspect of the present invention, a circuit connection member includes a pressing member, an elastic body, and an anisotropic conductive sheet.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

Figure 4:
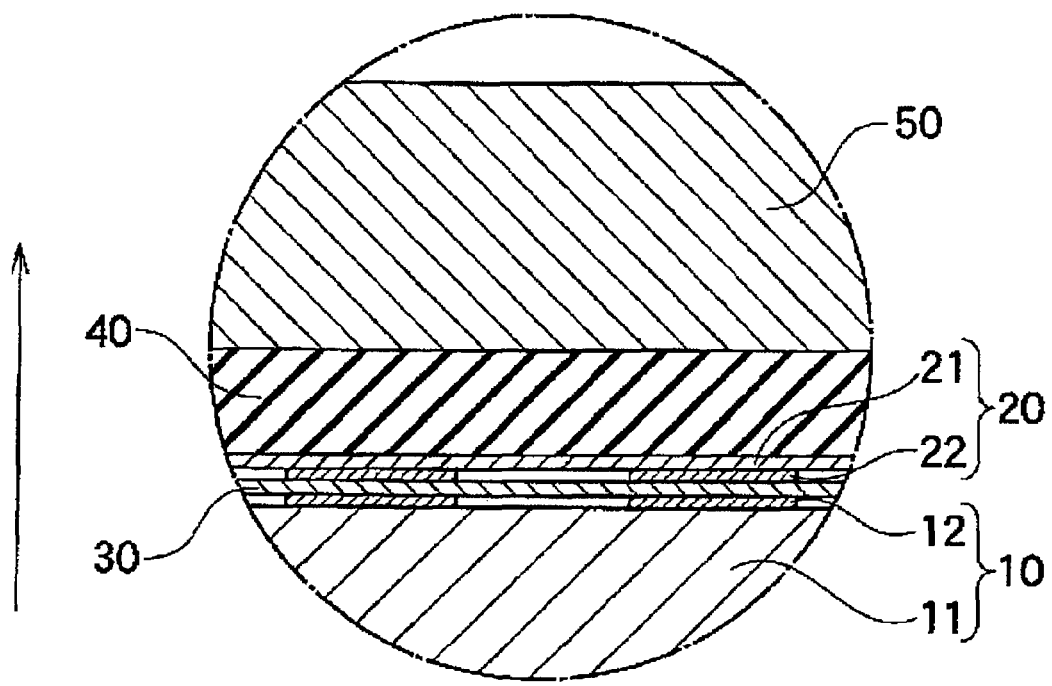
FIG. 4 is an enlarged view of an area a shown in FIG. 3B (cross-sectional view along the line A-A' shown in FIG. 2)

An electronic part, an electronic member connection method, and a circuit connection member according to the embodiments of the invention are described in detail below with reference to the drawings, wherein like reference numerals designate corresponding or identical elements throughout the various drawings. Note that the invention is not limited to embodiments illustrated in the drawings. Note that the height or the thickness of each member refers to the dimension of each member in the stacking direction (e.g., an arrow direction in FIG. 4).

Electronic Part

An electronic part according to one embodiment of the invention includes a first electronic member, an anisotropic conductive sheet that is disposed on a wiring side (i.e., a side where wires (circuit) are formed) of the first electronic member, a second electronic member that is disposed on a side of the anisotropic conductive sheet opposite to the side where the first electronic member is disposed, and is electrically connected to the first electronic member through the anisotropic conductive sheet, an elastic body that is disposed on a side of the second electronic member opposite to the side where the anisotropic conductive sheet is disposed, and a pressing member that is disposed on a side of the elastic body opposite to the side where the second electronic member is disposed, the first electronic member being electrically connected to the second electronic member.

It is preferable that the electronic part according to one embodiment of the invention further include a holding member that includes at least a side wall and a top plate, and is disposed on the first electronic member, and the top plate of the holding member press at least part of an upper surface of the pressing member against the second electronic member. According to this configuration, since the holding member that presses the pressing member is disposed on the first electronic member, the size of the electronic part can be advantageously reduced.

Electronic Part According to First Embodiment

Figure 2:
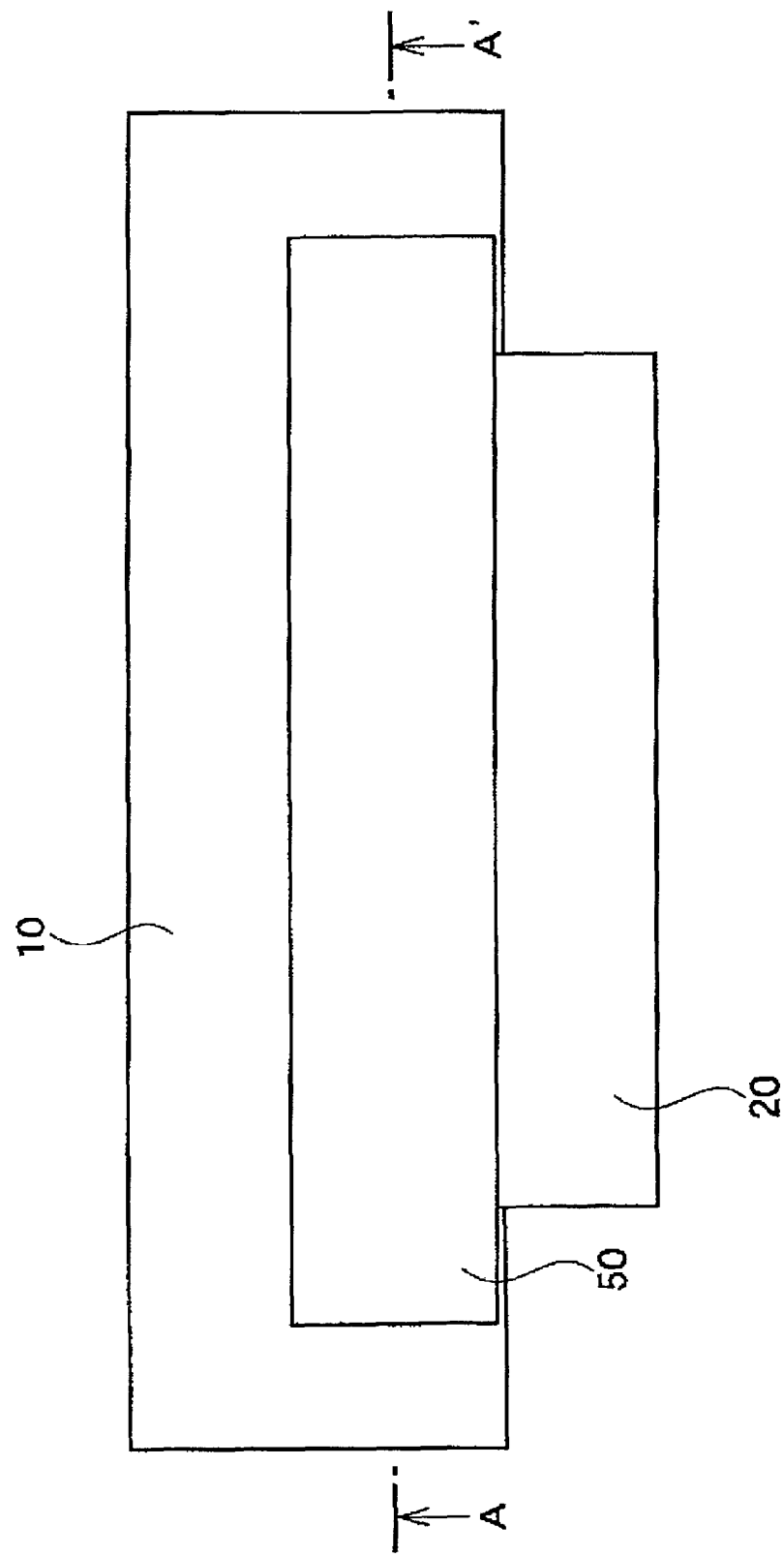
FIG. 2 is a top view showing the electronic part according to the first embodiment.
Figure 3A:
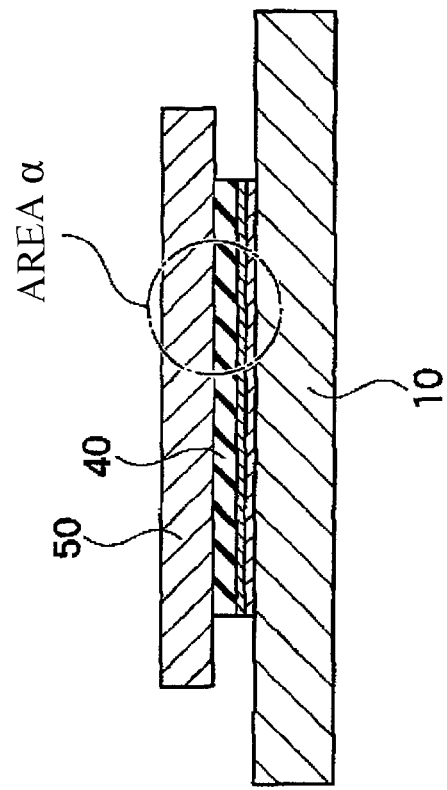
FIGS. 3A and 3B are cross-sectional views along the line A-A' shown in FIG. 2.
Figure 3B:
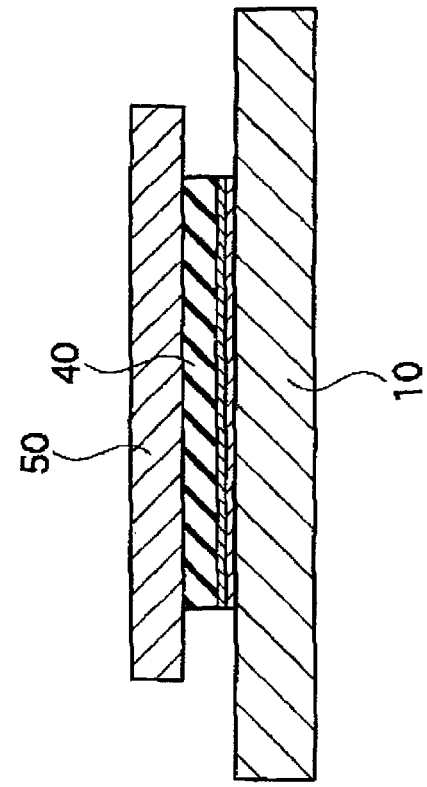

An electronic part according to a first embodiment of the invention is described below with reference to FIG. 1 (perspective view), FIG. 2 (top view), FIGS. 3A and 3B (cross-sectional view along the line A-A' shown in FIG. 2; FIG. 3A shows a case where the pressurizing member is not pressed, and FIG. 3B shows a case where the pressurizing member is pressed), and FIG. 4 (enlarged view showing an area a in the cross-sectional view along the line A-A'). The electronic part according to the first embodiment is an example in which a rigid printed circuit board (first electronic member 10) and a flexible printed circuit board (second electronic member 20) are electrically connected through an anisotropic conductive sheet 30.

In the electronic part according to the first embodiment, the anisotropic conductive sheet 30 (thickness: 0.05 mm) is disposed on the wiring side of the first electronic member 10, and is optionally secured using an appropriate means (e.g., adhesive or jig structure). The first electronic member 10 includes a rigid substrate 11 (thickness: 0.6 mm), a plurality of wires, and a plurality of electrodes 12 (thickness: 0.01 mm, width: 0.15 mm, pitch: 0.15 mm) that are disposed in a pattern corresponding to the pattern of electrodes 22 of the second electronic member 20.

The second electronic member 20 is disposed on the first electronic member 10 through the anisotropic conductive sheet 30. The anisotropic conductive sheet 30 is sandwiched between the first electronic member 10 and the second electronic member 20. The second electronic member 20 includes a flexible substrate 21 (thickness: 0.05 mm), a plurality of wires, and a plurality of electrodes 22 (thickness: 0.016 mm, width: 0.15 mm, pitch: 0.15 mm) that are disposed in a pattern corresponding to the pattern of the electrodes 12 of the first electronic member 10.

An elastic body 40 (thickness: 0.35 mm) is disposed on the second electronic member 20, and a pressing member 50 (thickness: 0.5 mm) is disposed on the elastic body 40.

The pressing member 50 is pressed against the second electronic member 20, and the force applied to the elastic body 40 from the pressing member 50 is applied to the second electronic member 20 and the anisotropic conductive sheet 30, so that the first electronic member 10 is electrically connected to the second electronic member 20. Specifically, the electrodes 12 of the first electronic member 10 are electrically connected to the electrodes 22 of the second electronic member 20 through the anisotropic conductive sheet 30.

Note that the term "jig structure" refers to a structure that allows a member to be fitted into another member due to their shape (e.g., engagement structure or hook structure).

Electronic Part According to Second Embodiment

Figure 5:
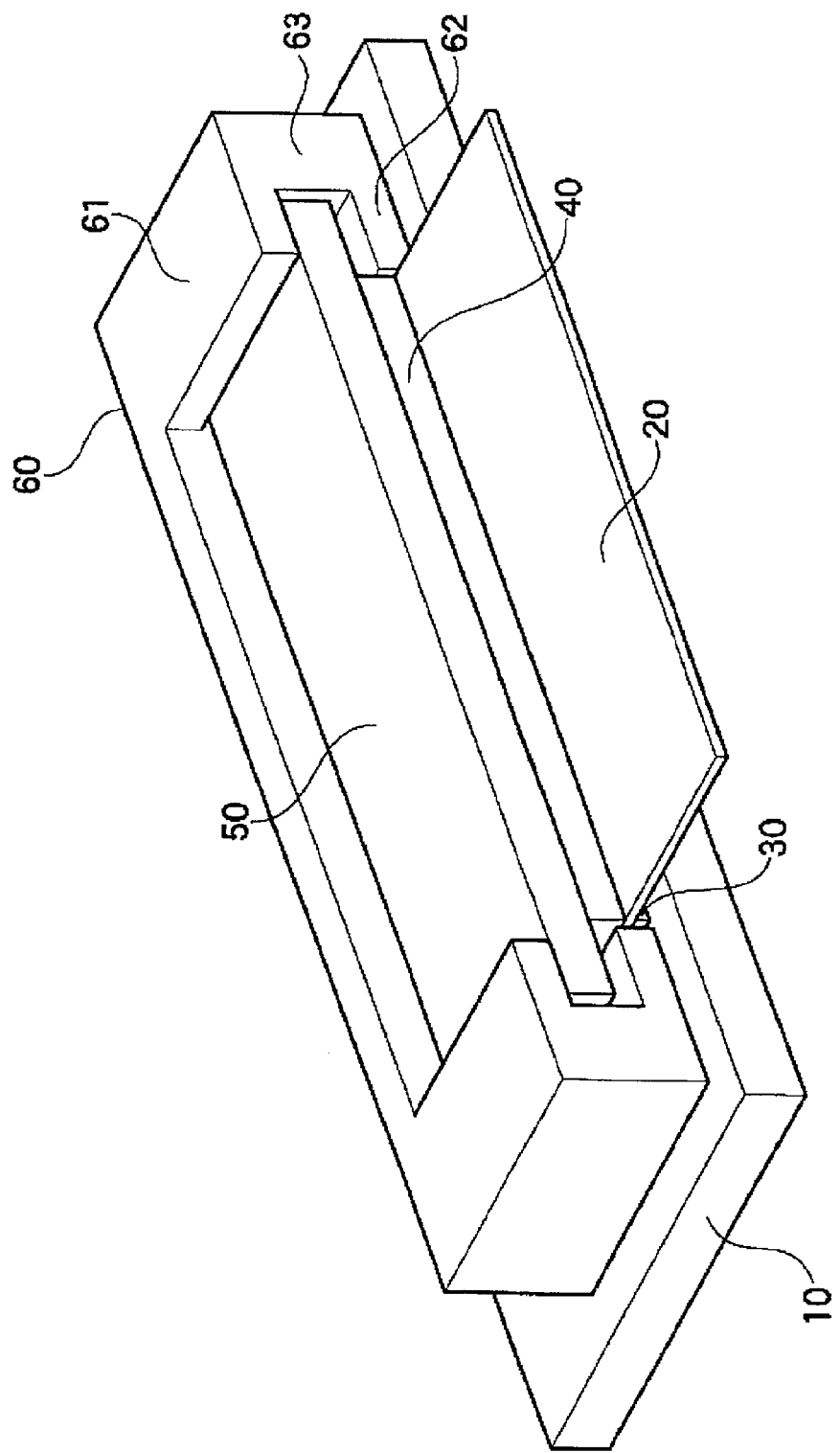
FIG. 5 is a perspective view showing an electronic part according to a second embodiment.
Figure 6:
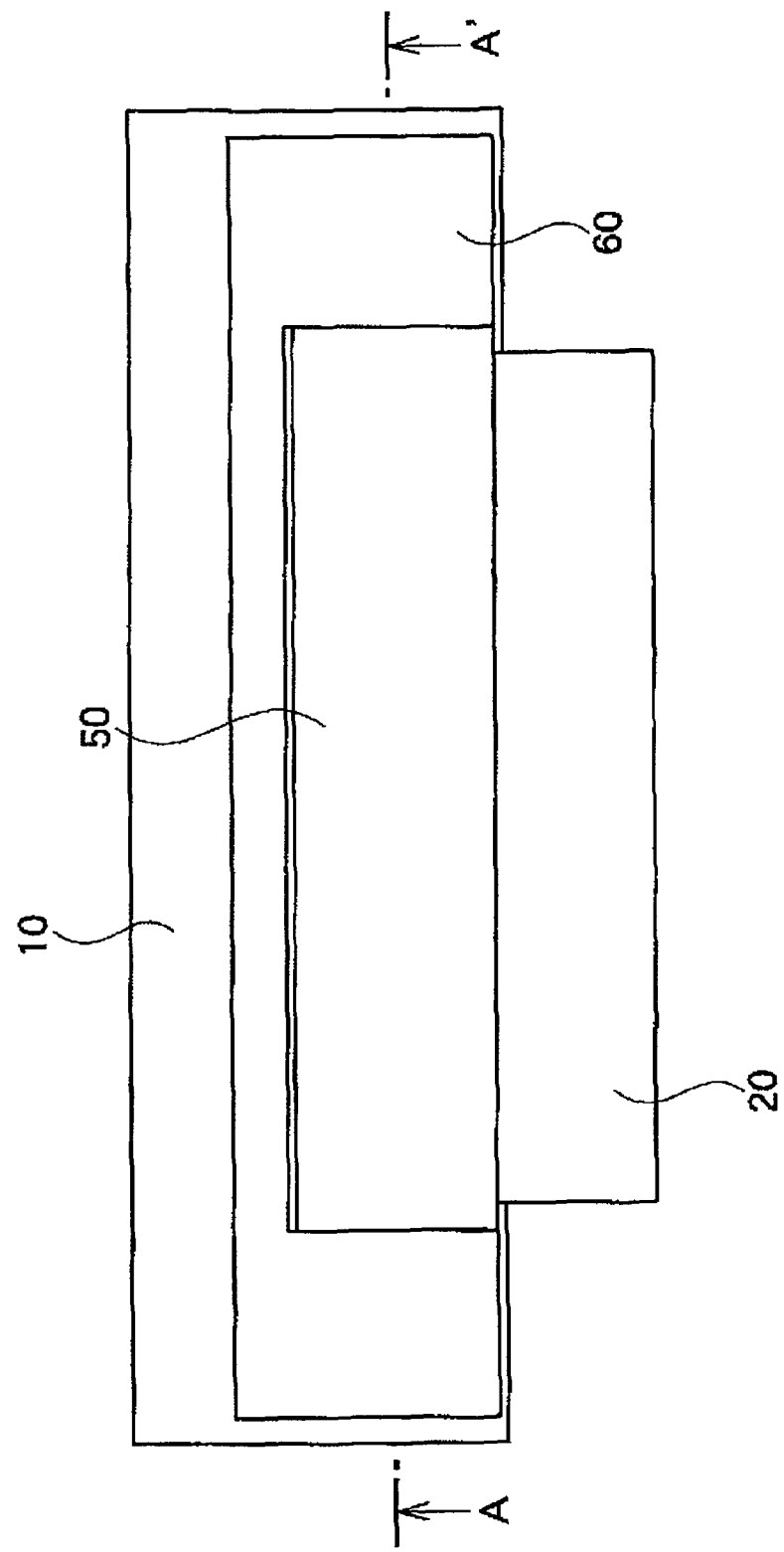
FIG. 6 is a top view showing the electronic part according to the second embodiment.
Figure 7:
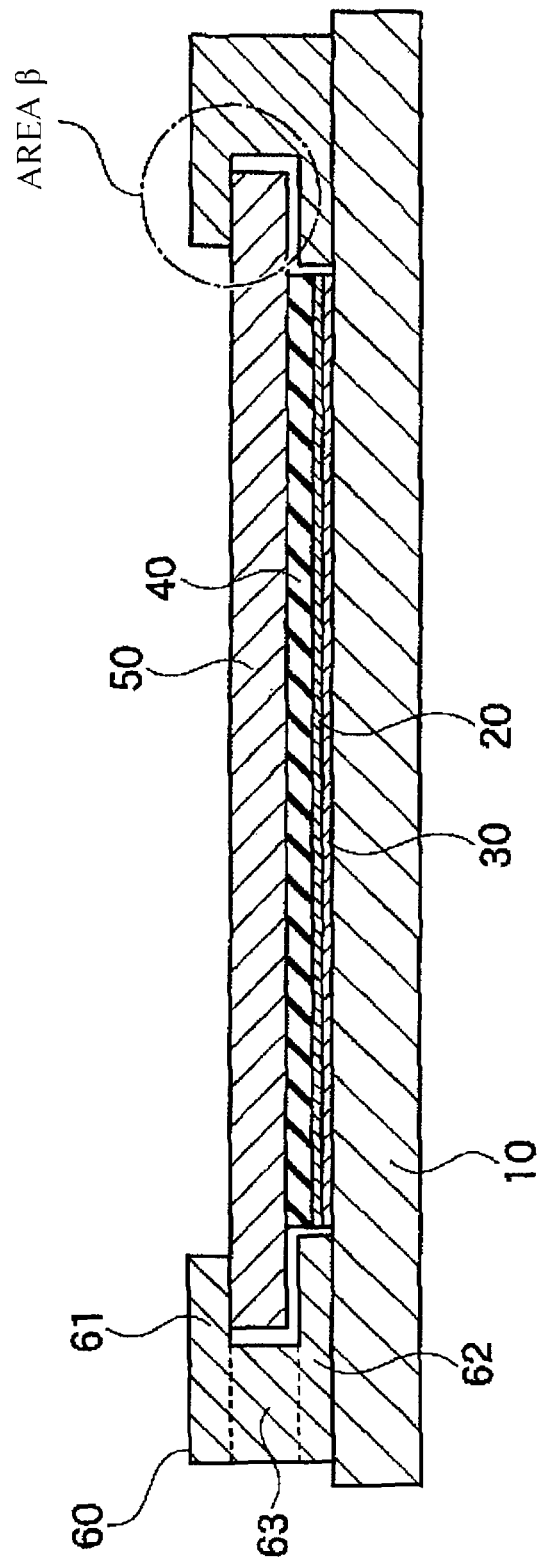
FIG. 7 is a cross-sectional view along the line A-A' shown in FIG. 6.

An electronic part according to a second embodiment of the invention is described below with reference to FIG. 5 (perspective view), FIG. 6 (top view), FIG. 7 (cross-sectional view along the line A-A' shown in FIG. 6), and FIG. 8 (enlarged view showing an area β in the cross-sectional view along the line A-A'). The electronic part according to the second embodiment differs from the electronic part according to the first embodiment in that the electronic part according to the second embodiment further includes a holding member 60 (height: 1.25 mm) that is disposed on the first electronic member 10, the holding member 60 including at least a top plate 61 (thickness: 0.35 mm), a bottom plate 62 (thickness: 0.35 mm), and a side wall 63 (height: 0.55 mm) that connects the top plate 61 and the bottom plate 62. The holding member 60 is optionally secured on the first electronic member 10 using an appropriate means (e.g., adhesive or jig structure).

The top plate 61 of the holding member 60 presses the upper surface of at least one pair of ends of the pressing member 50 against the second electronic member 20. This causes the pressing member 50 to be pressed against the elastic body 40, and the second electronic member 20 and the anisotropic conductive sheet 30 are pressed against the first electronic member 10 due to the pressing force, so that the first electronic member 10 is electrically connected to the second electronic member 20.

Figure 8:
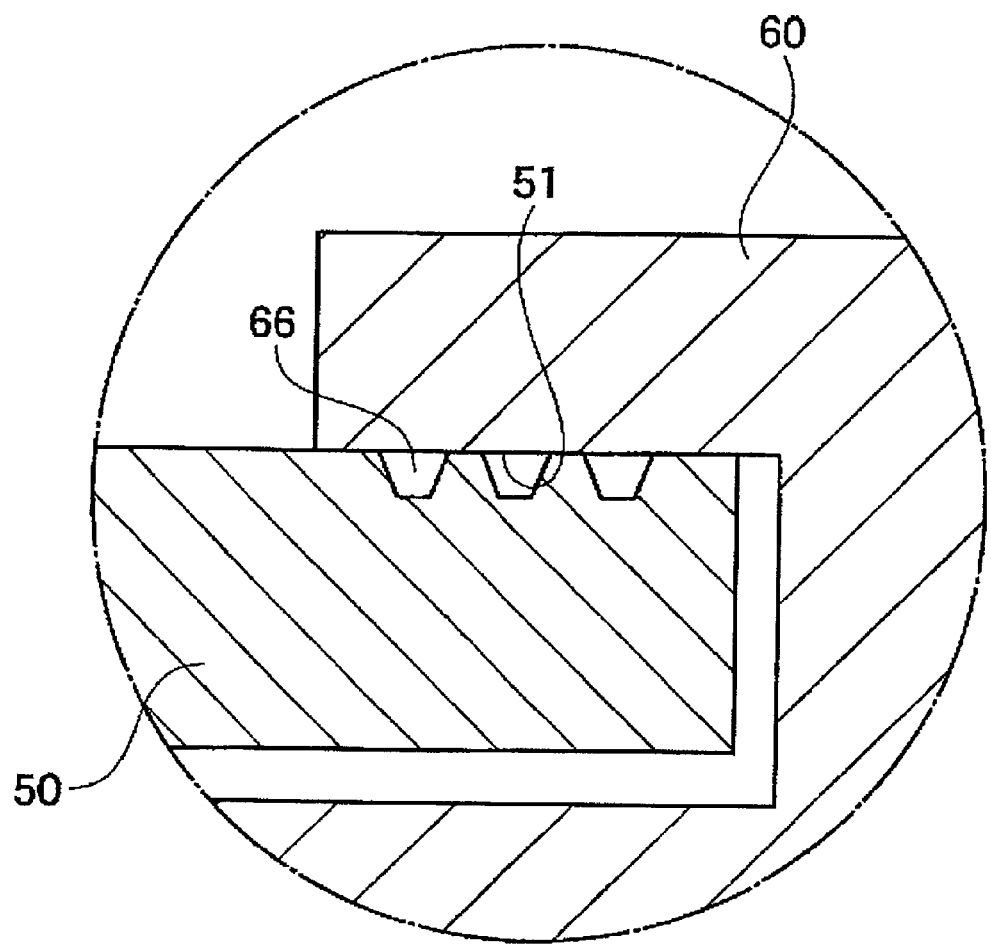
FIG. 8 is an enlarged view of an area 13 shown in FIG. 7 (cross-sectional view along the line A-A' shown in FIG. 6)

As shown in FIG. 8, the top plate 61 of the holding member 60 and the pressing member 50 may have protrusions or depressions (e.g., protrusion 66 or depression 51) so that the bottom surface of the top plate 61 of the holding member 60 can be fitted into the upper surface of the pressing member 50 at the contact surface of the top plate 61 of the holding member 60 and the pressing member 50. This makes it possible to more firmly (closely) secure the holding member 60 and the pressing member 50.

Electronic Part According to Third Embodiment

Figure 9:
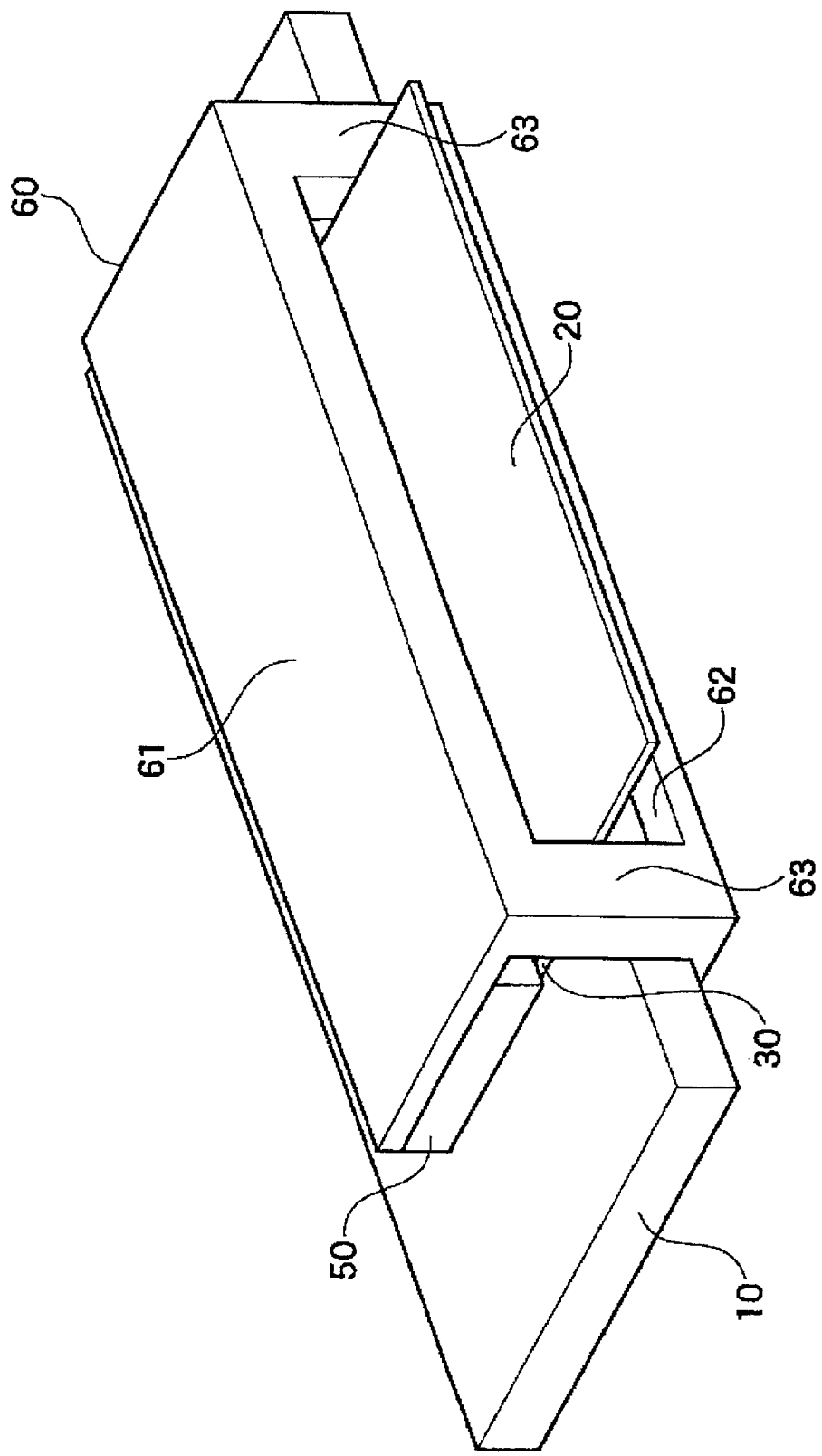
FIG. 9 is a perspective view showing an electronic part according to a third embodiment.
Figure 10:
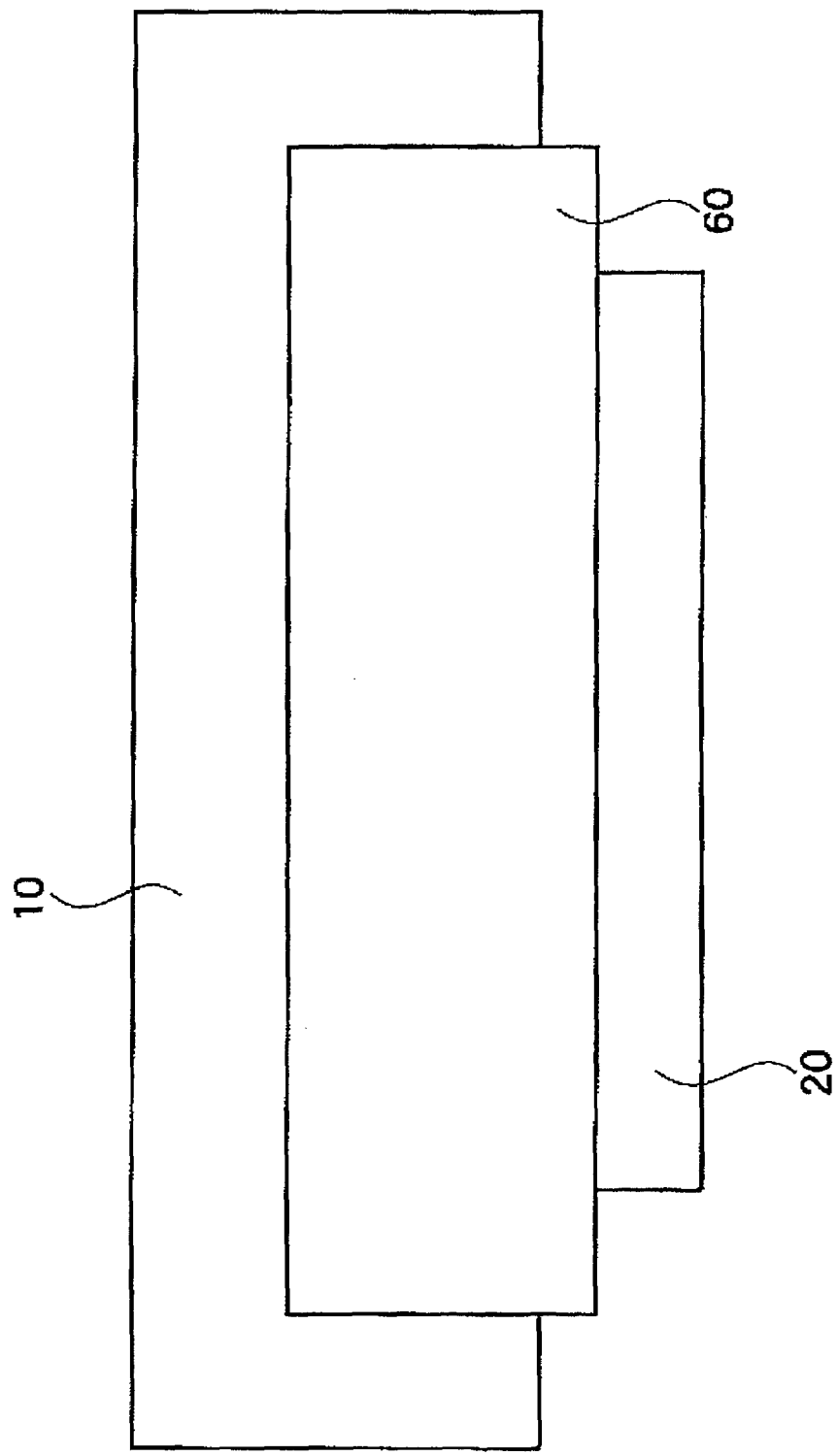
FIG. 10 is a top view showing the electronic part according to the third embodiment.
Figure 11:
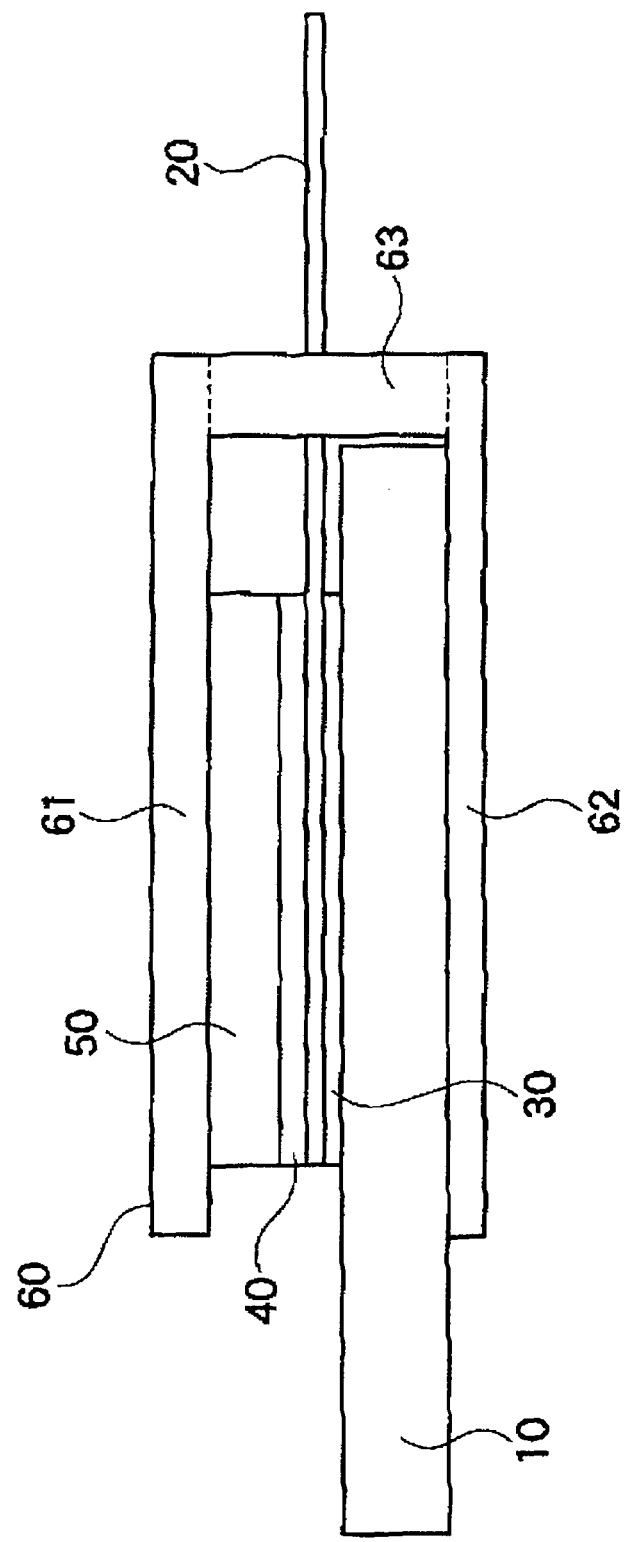
FIG. 11 is a side view showing the electronic part according to the third embodiment.

An electronic part according to a third embodiment of the invention is described below with reference to FIG. 9 (perspective view), FIG. 10 (top view), and FIG. 11 (side view). The electronic part according to the third embodiment differs from the electronic part according to the first embodiment in that the electronic part according to the third embodiment further includes a holding member 60 (holding member having a sandwich structure) that includes a top plate 61 (thickness: 0.2 mm), a bottom plate 62 (thickness: 0.2 mm) that is positioned opposite to the top plate 61, and a side wall 63 (height: 1.5 mm) that connects the top plate 61 and the bottom plate 62. In the third embodiment, the side wall 63 has an opening. The holding member 60 is optionally secured on the first electronic member 10 using an appropriate means (e.g., adhesive or jig structure). The holding member 60 is disposed so that the side wall 63 is parallel to the longitudinal direction of the pressing member 50.

The pressing member 50 is secured on the holding member 60 using a holding section (not shown). The first electronic member 10 is secured on the upper surface of the bottom plate 62 of the holding member 60. In the third embodiment, the holding member 60 holds each member. As shown in FIGS. 9 to 11, the holding member 60 holds each member so that the side wall 63 of the holding member 60 is parallel to the longitudinal direction of the pressing member 50, and the second electronic member 20 extends through the opening formed in the side wall 63.

According to the third embodiment, the back surface of the substrate 11 of the first electronic member 10 can be supported by the bottom plate 62 of the holding member 60 by utilizing the holding member 60 having the above structure, so that a local force applied to the substrate 11 can be dispersed.

The top plate 61 of the holding member 60 presses the upper surface of the pressing member 50 against the second electronic member 20. This causes the pressing member 50 to be pressed against the elastic body 40, and the second electronic member 20 and the anisotropic conductive sheet 30 are pressed against the first electronic member 10 due to the pressing force, so that the first electronic member 10 is electrically connected to the second electronic member 20.

Each member of the electronic part according to each embodiment of the invention is described in detail below.

First Electronic Member

The first electronic member is not particularly limited. Various electronic members may be used as the first electronic member. Examples of such electronic members include printed circuit boards such as a rigid printed circuit board (PCB), a flexible printed circuit board (FPC), and a flex-rigid printed circuit board. Any of a single-sided printed circuit board, a double-sided printed circuit board, and a multilayer printed circuit board may be used. The first electronic member (e.g., printed circuit board) includes a substrate, a plurality of wires, and a plurality of electrodes that are disposed in a pattern corresponding to the pattern of the electrodes of the second electronic member, the plurality of wires and the plurality of electrodes being formed on the substrate.

Examples of the material for the PCB rigid substrate include composite resin materials such as a glass fiber-reinforced epoxy resin, a glass fiber-reinforced phenol resin, a glass fiber-reinforced polyimide resin, and a glass fiber-reinforced bismaleimide triazine resin; ceramic materials such as silicon dioxide and alumina; and the like. Examples of the material for the PCB flexible substrate include polyimide, polyamide, polyester, polysulfone, and the like.

Examples of the material for the wires and electrodes included in the first electronic member include gold, silver, copper, nickel, palladium, carbon, aluminum, indium tin oxide (ITO), and the like. The pitch of the electrodes included in the first electronic member is normally 0.1 to 5 mm. The thickness of the substrate included in the first electronic member is normally 0.1 to 5 mm.

Second Electronic Member

The second electronic member is not particularly limited. Various electronic members may be used as the second electronic member. Examples of such electronic members include the above printed circuit boards, transistors, diodes, relays, switches, IC chips, LSI chips, packages thereof, modules such as a multichip module (MCM), passive components such as a resistor, a capacitor, a crystal vibrator, a speaker, a microphone, a transformer (coil), and an inductor, display panels such as a TFT liquid crystal display panel, a STN liquid crystal display panel, a plasma display panel, and an electroluminescence panel, and the like. The second electronic member (e.g., printed circuit board) includes a substrate, a plurality of wires, and a plurality of electrodes that are disposed in a pattern corresponding to the pattern of the electrodes of the first electronic member, the plurality of wires and the plurality of electrodes being formed on the substrate.

Examples of the material for the wires and electrodes included in the second electronic member include gold, silver, copper, nickel, palladium, carbon, aluminum, indium tin oxide (ITO), and the like. The pitch of the electrodes included in the second electronic member is normally 0.1 to 5 mm. The thickness of the substrate included in the second electronic member is normally 0.01 to 5 mm.

Anisotropic Conductive Sheet

The anisotropic conductive sheet allows electrical connection only in the thickness direction. In order to ensure the reliability of the electronic part, the anisotropic conductive sheet is preferably a dispersion-type anisotropic conductive sheet in which conductive particles are uniformly dispersed in the plane direction of the sheet, or an unevenly distributed anisotropic conductive sheet that includes a plurality of conductive sections that include conductive particles and correspond to the electrodes included in the first electronic member and the second electronic member, and an insulating section that insulates the plurality of conductive sections. The conductive sections may be formed by disposing thin conductor wires (metal wires formed of copper, aluminum, or the like) at given intervals.

The anisotropic conductive sheet is formed using a sheet-forming material that includes an insulating polymer material and conductive particles, for example. Examples of the insulating polymer material include silicone rubber, ethylene-propylene rubber, polyurethane rubber, fluororubber, polyester rubber, styrene-butadiene rubber, styrene-butadiene block copolymer rubber, styrene-isopropylene block copolymer rubber, a soft epoxy resin, and the like.

The content (volume fraction) of the conductive particles in the dispersion-type anisotropic conductive sheet is normally 3 to 50%, preferably 5 to 25%, and more preferably 7 to 23%.

The insulating section of the unevenly distributed anisotropic conductive sheet is formed of a polymer material to enclose the plurality of conductive sections in the plane direction, and insulate the plurality of conductive sections so that the conductive sheet has insulating properties in the plane direction. The diameter of the conductive section is normally 0.02 to 5 mm, and preferably 0.05 to 1 mm.

The anisotropic conductive sheet may include a protrusion section that includes a tabular section and a conductive section that protrudes from the tabular section, and is provided on at least one of the upper surface and the bottom surface thereof. The shape of the protrusion section is not particularly limited, but may be disk-like, for example. If the anisotropic conductive sheet includes such a protrusion section, the load applied to the electrodes when the anisotropic conductive sheet is pressed can be reduced.

When using a related-art method, the anisotropic conductive sheet is disposed between the first electronic member and the second electronic member, and the first electronic member and the second electronic member are pressed against the anisotropic conductive sheet so that the first electronic member and the second electronic member can be reliably connected by absorbing a variation in height. However, when using an anisotropic conductive sheet having a small thickness in order to deal with a demand for a reduction in size of electronic parts, the amount of displacement of the sheet upon pressing (i.e., the cushioning capability of the sheet upon pressing) may be insufficient. On the other hand, when using an anisotropic conductive sheet having a large thickness, the ability to insulate a plurality of electrodes disposed in the plane direction of the electronic member may gradually deteriorate. Specifically, the conductive particles included in the sheet and present between adjacent electrodes of the electronic member may come in contact with each other as the thickness of the anisotropic conductive sheet increases, so that the ability to insulate the electrodes may deteriorate.

According to each embodiment of the invention, the amount of displacement of the sheet upon pressing (i.e., the cushioning capability of the sheet upon pressing) is sufficient even when using an anisotropic conductive sheet having a small thickness. Therefore, two electronic members can be connected even when using an anisotropic conductive sheet having a small thickness in order to reduce the size of the electronic part. For example, the thickness of the anisotropic conductive sheet is normally about 200 µm or less, preferably 10 to 100 µm, and particularly preferably 10 to 60 µm.

Elastic Body

The elastic body is preferably a non-conductive elastic body, and more preferably an elastic body formed of a non-conductive synthetic rubber. When using a non-conductive elastic body, the risk of leakage from the electronic part can be reduced. When using an elastic body formed of a synthetic rubber, the anisotropic conductive sheet can be uniformly pressed, so that stable and good electrical connection can be achieved. Examples of the material for the elastic body include non-foam materials such as silicone rubber, polybutadiene rubber, natural rubber, polyisoprene rubber, polyurethane rubber, chloroprene rubber, polyester rubber, styrene-butadiene copolymer rubber, and epichlorohydrin rubber, and foam materials made thereof, and the like. Among these, it is most preferable to use silicone rubber that exhibits excellent electrical insulating properties, heat resistance, and compression set.

Figure 1:
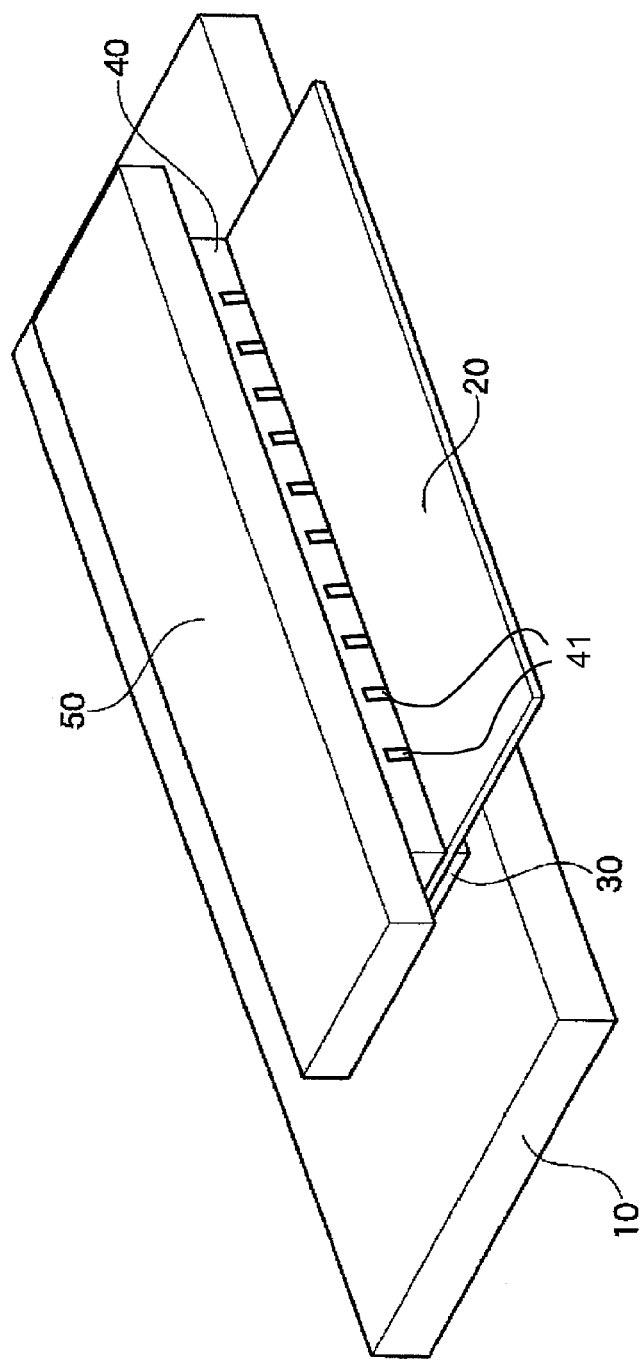
FIG. 1 is a perspective view showing an electronic part according to a first embodiment.

It is preferable that slits 41 be formed at given intervals in the elastic body on the side where the second electronic member is disposed (i.e., the side of the elastic body that comes in contact with the second electronic member), as shown FIG. 1. The cushioning capability of the elastic body when pressed by the pressing member is improved by forming such slits (i.e., a space that allows the elastic body to be displaced when pressed by the pressing member). The slits may be arranged in one direction or two or more directions. The size of the slits is appropriately determined within a range that allows the strength of the elastic body to be maintained, but is normally 1 to 1000 mm$^3$.

The thickness of the elastic body is normally 0.001 to 1 mm. When it is desired to further reduce the size of the electronic part, the thickness of the elastic body is preferably 0.001 to 0.6 mm, and more preferably 0.01 to 0.4 mm.

The ratio ($Y_1/Y_2$) of the Young's modulus $Y_1$ of the anisotropic conductive sheet to the Young's modulus $Y_2$ of the elastic body is preferably 1 to 1000, and more preferably 10 to 100, taking account of the balance between a reduction in load applied to the anisotropic conductive sheet and the uniformity of in-plane load applied to the anisotropic conductive sheet.

A non-conductive spring (preferably a non-conductive leaf spring) may be used as the elastic body. For example, a leaf spring formed of a synthetic resin such as Delrin (manufactured by DuPont) may be used. The leaf spring may have a cross-sectional shape approximately in the shape of the letter "U", a meandering shape, or the like. A plurality of leaf springs may be disposed on the second electronic member. An electronic part that can withstand a high pressing force can be produced by utilizing a non-conductive spring as the elastic body.

Pressing Member

The pressing member is normally formed of a thermoplastic resin. When producing an electronic part that is required to exhibit high heat resistance, the pressing member is preferably formed of a super-engineering plastic such as polyphenylene sulfide, polytetrafluoroethylene, polysulfone, polyethersulfone, amorphous polyallylate, polyether ether ketone, thermoplastic polyimide, or polyamideimide.

The shape of the pressing member is not particularly limited. The pressing member may normally be a plate-like member.

When using the holding member, the pressing member is normally secured on the top plate of the holding member. The pressing member may be secured on the top plate of the holding member using an adhesive, a jig structure, or the like. As shown in FIG. 8, the top plate 61 of the holding member 60 and the pressing member 50 may have protrusions or depressions (e.g., protrusion 66 or depression 51) so that the bottom surface of the top plate 61 of the holding member 60 can be fitted into the upper surface of the pressing member 50 at the contact surface of the top plate 61 of the holding member 60 and the pressing member 50. This makes it possible to more firmly (closely) secure the holding member 60 and the pressing member 50.

The thickness of the pressing member is normally 0.001 to 2 mm, and preferably 0.001 to 1 mm.

Holding Member

The holding member is not particularly limited insofar as the holding member includes at least the side wall and the top plate. The holding member is provided to press the pressing member, and also serves as a housing that receives each member.

Figure 12A:
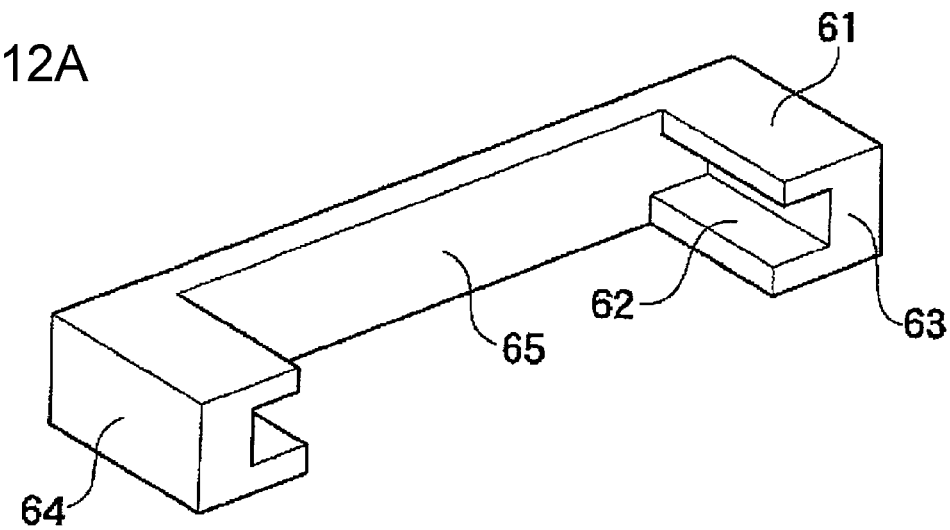
FIGS. 12A, 12B, and 12C are perspective views showing a holding member according to one embodiment.

The holding member may be configured so that (1) the holding member includes at least the top plate 61, the bottom plate 62, and the side wall 63 that connects the top plate 61 and the bottom plate 62. As shown in FIG. 12A, the holding member may include a pair of side sections 64, and a rear wall 65 that connects the pair of side sections 64 (the side section 64 is a member that has a cross-sectional shape approximately in the shape of the letter "U", and includes the top plate 61, the bottom plate 62, and the side wall 63 that connects the top plate 61 and the bottom plate 62).

Figure 12B:
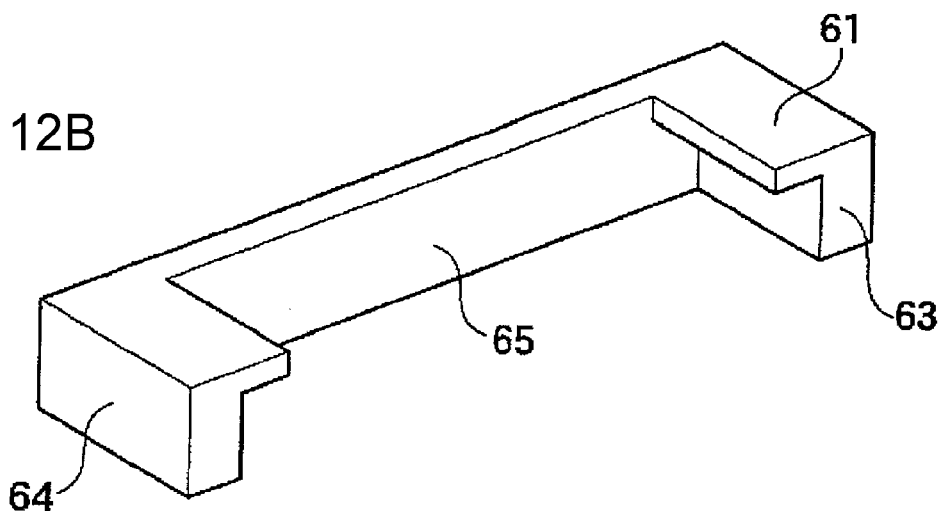

The holding member may be configured so that (2) the holding member includes at least the top plate 61 and the side wall 63. As shown in FIG. 12B, the holding member may include a pair of side sections 64, and a rear wall 65 that connects the pair of side sections 64 (the side section 64 is a member that has a cross-sectional shape approximately in the shape of the letter "L", and includes the top plate 61 and the side wall 63).

Figure 12C:
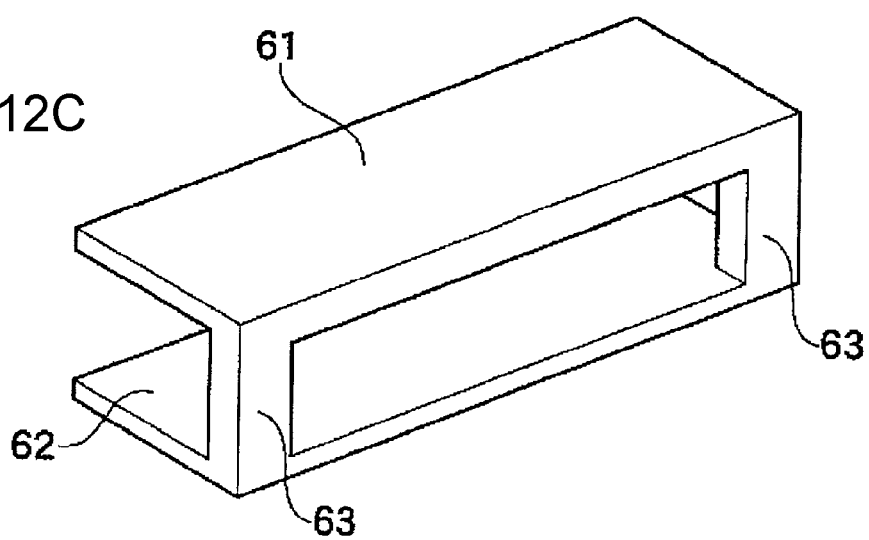

The holding member may be configured so that (3) the holding member includes the top plate 61, the bottom plate 62 that is positioned opposite to the top plate 61, and the side wall 63 that connects the top plate 61 and the bottom plate 62. As shown in FIG. 12C, the holding member may be configured so that the side wall 63 has an opening.

The holding member is normally formed of a thermoplastic resin in the same manner as the pressing member. When producing an electronic part that is required to exhibit high heat resistance, the holding member is preferably formed of a super-engineering plastic such as polyphenylene sulfide, polytetrafluoroethylene, polysulfone, polyethersulfone, amorphous polyallylate, polyether ether ketone, thermoplastic polyimide, or polyamideimide.

The holding member is optionally secured on the first electronic member using an appropriate means (e.g., adhesive or jig structure). The holding member may be secured using a positioning hole formed in the first electronic member.

The anisotropic conductive sheet, the second electronic member, the elastic body, and the pressing member may be secured on the holding member. For example, each end of the anisotropic conductive sheet, the second electronic member, the elastic body, and the pressing member may be secured on the holding member using a jig structure.

The holding member presses (compresses) the elastic body and the anisotropic conductive sheet, so that the electrodes of the first electronic member are electrically connected to the electrodes of the second electronic member.

Applications

The connection structure of the electronic parts according to each embodiment of the invention may suitably be applied for electrically connecting electronic members in the fields of electronic computers, digital clocks, electronic cameras, computer keyboards, and the like.

A portable electronic device having a reduced size and a reduced thickness can be implemented by incorporating the electronic part and the circuit connection member according to each embodiment of the invention in the portable electronic device. Examples of the portable electronic device include mobile phones, cameras (e.g., digital camera and video camera), portable audio players, portable DVD players, notebook personal computers, and the like.

Electronic Member Connection Method

An electronic member connection method according to one embodiment of the invention electrically connects a first electronic member and a second electronic member, and includes disposing an anisotropic conductive sheet between the first electronic member and the second electronic member, disposing an elastic body on the second electronic member, disposing a pressing member on the elastic body, and pressing the pressing member so that the first electronic member is electrically connected to the second electronic member.

Specifically, a force applied to the outer side of the pressing member is applied to the elastic body and the second electronic member through the elastic body, and the force applied to the second electronic member is applied to the anisotropic conductive sheet, so that the anisotropic conductive sheet is pressed against the first electronic member, and the first electronic member is electrically connected to the second electronic member.

It is preferable to dispose a holding member that includes at least a side wall and a top plate on the first electronic member, and cause the top plate of the holding member to press at least part of an upper surface of the pressing member against the second electronic member. This causes the pressing member to be pressed against the elastic body, so that the first electronic member is electrically connected to the second electronic member. Each member used in the electronic member connection method according to one embodiment of the invention is the same as that described in connection with the electronic part.

Circuit Connection Member

A circuit connection member according to one embodiment of the invention includes a pressing member, an elastic body, and an anisotropic conductive sheet, and preferably further includes a holding member that includes at least a side wall and a top plate. Each member included in the circuit connection member according to one embodiment of the invention is the same as that described in connection with the electronic part.

For example, the circuit connection member according to one embodiment of the invention includes a holding member that includes at least a side wall and a top plate, a pressing member that is secured on the bottom surface of the top plate of the holding member, an elastic body that is secured on the bottom surface of the pressing member, and an anisotropic conductive sheet that is secured on the side wall of the holding member, and is positioned at a given interval from the elastic body. When using a holding member having the above sandwich structure, the upper surface of the pressing member is secured on the bottom surface of the top plate of the holding member, and the anisotropic conductive sheet is disposed so that the bottom plate of the holding member is positioned at a given interval from the anisotropic conductive sheet.

The above embodiments of the invention are merely examples, and the scope of the invention is not limited to the above embodiments. The scope of the invention is defined by the appended claims, and the invention includes various modifications without departing from the scope of the invention.

According to the embodiment of the invention, since the load applied to the anisotropic conductive sheet can be reduced, the size of the anisotropic conductive sheet can be reduced. This makes it possible to reduce the size of the electronic part. Therefore, the embodiment of the invention is useful in the field of portable electronic devices such as mobile devices.

The embodiment of the present invention provides an electronic part in which two electronic members are connected, and which achieves a sufficient cushioning capability upon pressing even when using an anisotropic conductive sheet having a small thickness in order to reduce the size of the electronic part.

Obviously, numerous modifications and variations of the invention are possible in light of the above teachings. It is therefore to be understood that within the scope of the appended claims, the invention may be practiced otherwise than as specifically described herein.

What is claimed as new and desired to be secured by Letters Patent of the United States is:

1. An electronic part comprising:
   a first electronic member having a wiring side;
   an anisotropic conductive sheet having a first side and a second side opposite to the first side and disposed on the first electronic member so that the wiring side of the first electronic member contacts the first side of the anisotropic conductive sheet;
   a second electronic member having a third side and a fourth side opposite to the third side and disposed on the anisotropic conductive sheet so that the second side of the anisotropic conductive sheet contacts the third side of the second electronic member, the second electronic member being electrically connected to the first electronic member through the anisotropic conductive sheet;
   an elastic body having a fifth side and a sixth side opposite to the fifth side and disposed on the second electronic member so that the fourth side of the second electronic member contacts the fifth side of the elastic body; and
   a pressing member disposed on the sixth side of the elastic body,
   wherein slits are formed on the fifth side in the elastic body with intervals.

2. The electronic part according to claim 1, wherein the anisotropic conductive sheet has a thickness of about 200 μm or less.

3. The electronic part according to claim 1, further comprising:
   a holding member that includes at least a side wall and a top plate and that is disposed on the first electronic member, the top plate of the holding member pressing at least a part of an upper surface of the pressing member against the second electronic member.

4. The electronic part according to claim 1, wherein the elastic body comprises a non-conductive elastic body.

5. The electronic part according to claim 4, wherein the non-conductive elastic body comprises non-conductive synthetic rubber.

6. An electronic member connection method comprising:
disposing an anisotropic conductive sheet between a first electronic member and a second electronic member;
disposing an elastic body on the second electronic member;
disposing a pressing member on the elastic body; and
pressing the pressing member toward the first electronic member so that the first electronic member is electrically connected to the second electronic member,
wherein slits are formed on a side of the elastic body in the elastic body with intervals, the side of the elastic body contacting the second electronic member.

7. The method according to claim 6,
wherein the anisotropic conductive sheet has a thickness of about 200 μm or less.

8. The method according to claim 6, further comprising:
disposing a holding member on the first electronic member, the holding member including at least a side wall and a top plate; and
pressing at least a part of an upper surface of the pressing member against the second electronic member with the top plate of the holding member.

9. The method according to claim 6,
wherein the elastic body comprises a non-conductive elastic body.

10. The method according to claim 9,
wherein the non-conductive elastic body comprises non-conductive synthetic rubber.

11. A circuit connection member comprising:
a pressing member;
an anisotropic conductive sheet; and
an elastic body configured to be pressed by the pressing member toward the anisotropic conductive sheet, and having a first surface and a second surface opposite to the first surface, the first surface being closer to the anisotropic conductive sheet than the second surface,
wherein slits are formed in the first surface of the elastic body with intervals.

12. The circuit connection member according to claim 11,
wherein the anisotropic conductive sheet has a thickness of about 200 μm or less.

13. The circuit connection member according to claim 11, further comprising:
a holding member including at least a side wall and a top plate.

14. The circuit connection member according to claim 11,
wherein the elastic body comprises a non-conductive elastic body.

15. The circuit connection member according to claim 14,
wherein the non-conductive elastic body comprises non-conductive synthetic rubber.

* * * * *